(12) United States Patent
Liaw

(10) Patent No.: US 6,239,014 B1
(45) Date of Patent: May 29, 2001

(54) TUNGSTEN BIT LINE STRUCTURE FEATURING A SANDWICH CAPPING LAYER

(75) Inventor: Ing-Ruey Liaw, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/374,313

(22) Filed: Aug. 16, 1999

(51) Int. Cl.[7] ................................................ H01L 21/4763
(52) U.S. Cl. ............................................. 438/616; 438/129
(58) Field of Search ..................................... 438/129, 130, 438/618, 620; 257/203, 204

(56) References Cited

U.S. PATENT DOCUMENTS

| | | | |
|---|---|---|---|
| 5,879,986 | 3/1999 | Sung | 438/253 |
| 5,895,239 | * 4/1999 | Jeng et al. | 438/239 |
| 6,025,645 | * 2/2000 | Tomita | 257/773 |

\* cited by examiner

*Primary Examiner*—Charles Bowers
*Assistant Examiner*—William M. Brewster
(74) *Attorney, Agent, or Firm*—George O. Saile; Stephen B. Ackerman

(57) ABSTRACT

A process of fabricating a tungsten bit line structure, capped with a composite insulator shape, has been developed. The process features the use of a silicon oxide component, used as part of the capping, composite shape, employed to reduce the coupling capacitance generated by the proximity of the tungsten bit line structure, to adjacent conductive structures. The silicon oxide component is formed on an underlying, thin silicon nitride shape, which in turn overlays the tungsten bit line structure, preventing oxidation of the tungsten surface during the silicon oxide deposition. A capping, silicon nitride shape is placed on the underlying silicon oxide component. The use of this sandwich, or composite insulator shape, allows a tungsten bit line structure, with a sheet resistance between about 1 to 3 ohms/square, to be realized, with a reduction in coupling capacitance, in turn realized via the use of the silicon oxide component.

21 Claims, 4 Drawing Sheets

TUNGSTEN BIT LINE STRUCTURE FEATURING A SANDWICH CAPPING LAYER

BACKGROUND OF THE INVENTION

(1) Field of the Invention

The present invention relates to methods used to fabricate semiconductor devices, and more specifically to a method used to create a bit line structure, for a semiconductor device.

(2) Description of Prior Art

Bit line structures, for semiconductor devices such as dynamic random access memory, (DRAM), have been fabricated using conductive layers such as doped polysilicon, metal silicide, or metal. In addition these same bit line structures have been capped, or encapsulated with silicon nitride, to allow self-alignment of the bit line structure to underlying structures, or to allow self-alignment of subsequent overlying structures to the bit line structure, to be accomplished. The use of a high dielectric constant, silicon nitride layer, as a capping layer for the bit line structures, can howver result in performance degrading coupling capacitances, as a result of the proximity of adjacent conductive structures, to the silicon nitride capped, bit line structure. A solution used to lower the performance degrading coupling capacitance, has been the use of a silicon oxide layer, located between the overlying silicon nitride layer, and the underlying, conductive bit line shape. The use of the lower dielectric constant silicon oxide layer, results in a reduction in coupling capacitance when compared to counterparts fabricated only the silicon nitride capping layer.

To further increase device performance the bit line structure can be formed from tungsten, offering a sheet resistance between about 1 to 3 ohms/square, compared to counterparts fabricated from tungsten silicide layers, with a sheet resistance between about 5 to 10 ohms/square. However during the formation of the silicon oxide layer, used to reduce coupling capacitance, the surface of the underlying tungsten shape can be oxidized, resulting in unwanted consumption of tungsten, increasing the resistance of the bit line structure. This invention will teach a process sequence in which a silicon oxide layer can be used as part of a composite, or sandwich, capping layer, however avoiding the risk of oxidizing the underlying tungsten bit line. This is accomplished by initially depositing a thin underlying silicon nitride, directly on the tungsten layer, used for the bit line, followed by the deposition of the needed silicon oxide layer, and of the overlying silicon nitride layer, used for self-alignment purposes. After patterning a silicon nitride capped, tungsten bit line structure is realized, featuring the use of the silicon oxide layer, used to reduce coupling capacitance, but placed on a thin underlying silicon nitride layer, to avoid reaction with tungsten. Prior art, such as Sung et al, in U.S. Pat. No. 5,879,986, describe a silicon nitride encapsulated bit line structure, however that prior art does not feature the use of a silicon oxide layer, as a component of the capping layer, and thus allowing performance degrading coupling capacitances to occur.

SUMMARY OF THE INVENTION

It is an object of this invention to fabricate a tungsten bit line structure, for a semiconductor device, with the tungsten bit line structure capped with an overlying composite insulator layer.

It is another object of this invention to use a silicon oxide layer, as a component of a composite insulator capping layer, to reduce coupling capacitance between the composite insulator capped, tungsten bit line structure, and adjacent conductive structures.

It is still another object of this invention to place the silicon oxide layer, of the composite insulator capping layer, on a thin underlying silicon nitride layer, avoiding oxidation of the surface of the tungsten bit line structure, during formation of the silicon oxide layer.

In accordance with the present invention a method of fabricating a tungsten bit line structure, capped with a composite insulator layer comprised of: an underlying, thin silicon nitride layer; a silicon oxide layer; and an overlying, capping silicon nitride layer; with the silicon oxide layer used to reduce the coupling capacitance between the bit line structure and adjacent conductive structures, is described. A bit line contact hole is formed in an insulator layer, exposing a source/drain region, located between silicon nitride encapsulated gate structures, followed by the formation of a bit line contact structure, residing in the bit line contact hole A titanium—titanium nitride layer, is deposited followed by the deposition of a tungsten layer. Deposition of a composite insulator layer, on the underlying tungsten layer, is next performed with the composite insulator layer comprised of: an underlying, thin silicon nitride layer; a silicon oxide layer, used to reduce coupling capacitance between a subsequent bit line structure, and adjacent conductive structures; and an overlying silicon nitride layer, used as the capping layer for the subsequent bit line structure. Conventional patterning procedures are next used to define a bit line shape in the composite insulator layer, followed by definition of the tungsten bit line structure, using the composite insulator shape as an etch mask. Silicon nitride spacers are then formed on the sides of the composite insulator capped, tungsten bit line structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating a tungsten bit line structure, capped with a composite insulator layer, featuring a silicon oxide component, used to reduce coupling capacitance between the composite insulator capped, tungsten bit line structure, and adjacent conductive structures, and featuring a thin silicon nitride component, placed between the overlying silicon oxide layer, and the underlying tungsten bit line structure, used to avoid oxidation of the tungsten surface during the formation of the silicon oxide layer, will now be described in detail. This invention will be described as applied to N channel, metal oxide semiconductor field effect transistor, (MOSFET), devices, however application of this invention can also be applied tor P channel devices.

Figure 1:
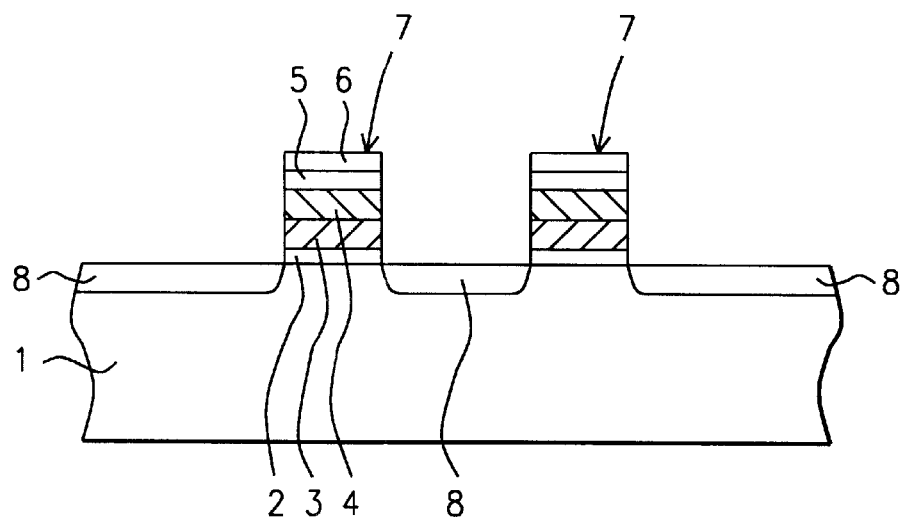
FIGS. 1–7, which schematically, in cross-sectional style, show key stages of fabrication used to create a tungsten bit line structure, capped with a composite insulator layer.

A semiconductor substrate 1, comprised of P type, single crystalline silicon, with a <100> crystallographic orientation, is used and schematically shown in FIG. 1. A gate insulator layer 2, comprised of silicon dioxide, is thermally grown to a thickness between about 50 to 200 Angstroms. Polysilicon layer 3, is next obtained via low pressure chemical vapor deposition, (LPCVD), or via plasma enhanced chemical vapor deposition, (PECVD), procedures, to a thickness between about 500 to 1500 Angstroms. Polysilicon layer 3, is either doped in situ, during deposition, via the addition of arsine, or phopshine, to a silane ambient, or deposited intrinsically than subjected to an ion implantation procedure, using arsenic, or phosphorous ions. Metal silicide layer 4, comprised of tungsten silicide, or titanium silicide, is then deposited via LPCVD procedures at a thickness between about 500 to 1500 Angstroms. Silicon oxide layer 5, at a thickness between about 100 to 2000 Angstroms, and overlying silicon nitride layer 6, at a thickness between about 300 to 2500 Angstroms, are next obtained via LPCVD or PECVD procedures. Conventional photolithographic and reactive ion etching, (RIE), procedures, using $CHF_3$ as an etchant for silicon nitride layer 6, using $CHF_3$ as an etchant for silicon oxide layer 5, and using $Cl_2$ as an etchant for metal silicide layer 4, and for polysilicon layer 3, are used to create silicon nitride capped, gate structures 7, schematically shown in FIG. 1. An N type, lightly doped source/drain region 8, also schematically shown in FIG. 1, is next formed in an area of semiconductor substrate 1, not covered by silicon nitride capped, gate structures 7, via ion implantation of arsenic, or phosphorous ions, at an energy between about 10 to 30 KeV, at a does between about 1E12 to 1E14 atoms/$cm^2$. Removal of the photoresist shape, used for definition of silicon nitride capped, gate structures 7, is accomplished via plasma oxygen ashing and careful wet cleans. The regions of gate insulator layer 2, not covered by silicon nitride capped, gate structures 7, are removed during the wet clean portion of the photoresist removal procedure.

Figure 2:
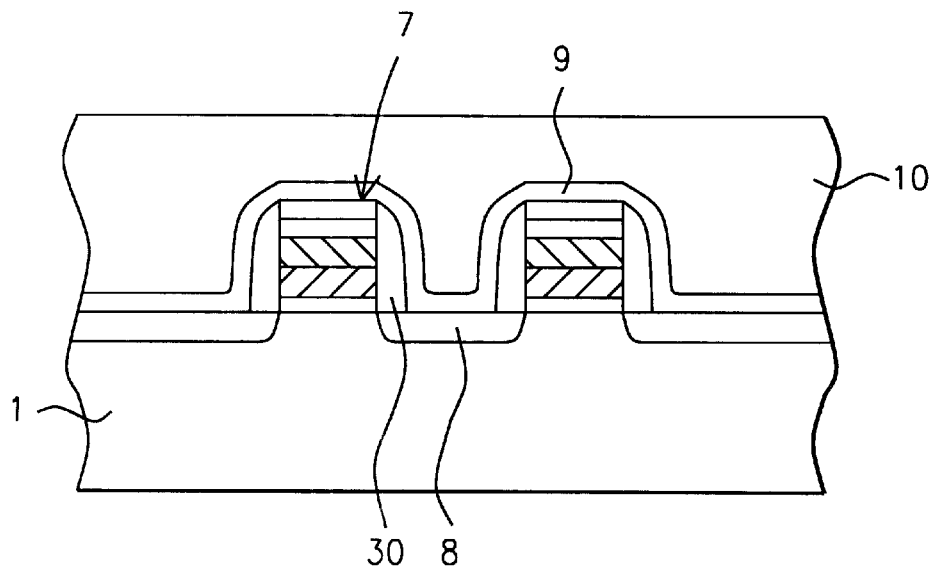

Silicon nitride spacers 30, schematically shown in FIG. 2, are next formed on the sides of silicon nitride capped, gate structures 7. This is accomplished via the deposition of a silicon nitride layer, at a thickness between about 100 to 1000 Angstroms, via LPCVD or PECVD procedures, followed by an anisotropic RIE procedure, using $CHF_3$ as an etchant. Silicon nitride layer 9, is then deposited, via LPCVD or PECVD procedures, at a thickness between about 100 to 800 Angstroms, followed by the deposition of a borophosphosilicate glass, (BPSG), layer 10, via LPCVD or PECVD procedures, at a thickness between about 5000 to 8000 Angstroms. BPSG layer 10, contains between about 3 to 5% $B_2O_3$, and between about 4 to 6% $P_2O_5$. A chemical mechanical polishing, (CMP), procedure is used for planarization purposes, resulting in a smooth top surface for BPSG layer 10. This is schematically shown in FIG. 2.

Figure 3:
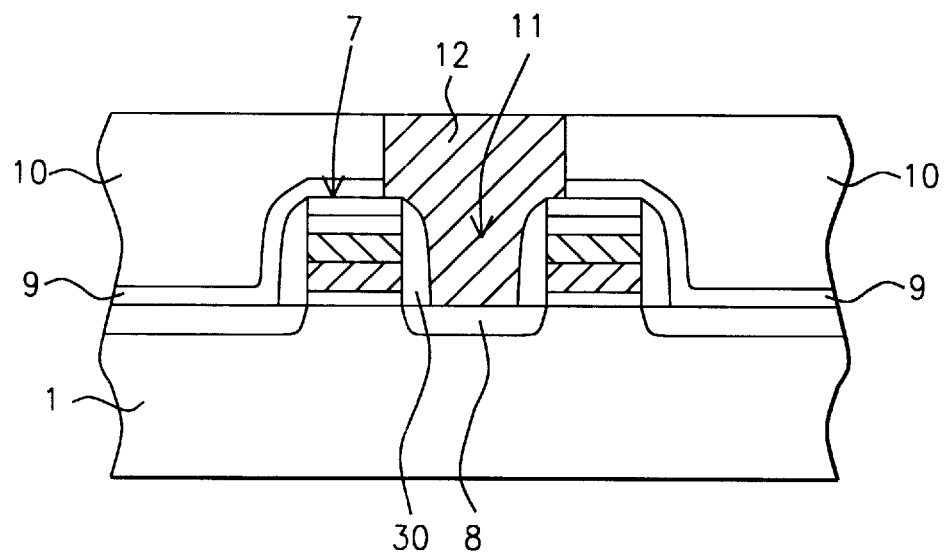

The formation of a bit line contact structure is next addressed, and schematically shown in FIG. 3. A self-aligned contact, (SAC), opening, or bit line contact hole 11, is formed in BPSG layer 10, and in silicon nitride layer 9, exposing lightly doped source/drain region 8. SAC opening 11, is formed via photolithographic and RIE procedures, using $CHF_3$ as an etchant for BPSG layer 10, while $CHF_3$ is also used as an etchant for silicon nitride layer 9. The diameter of SAC opening, or bit line contact hole 11, is between about 0.2 to 0.4 um, larger than the space between silicon nitride capped, gate structures 7, thus allowing a subsequent bit line structure to be fully landed on lightly doped source/drain region 8. After removal of the photoresist shape, used for definition of SAC opening 11, via plasma oxygen ashing and careful wet cleans, a conductive layer, such as doped polysilicon, tungsten, or tungsten silicide, is deposited via LPCVD procedures, at a thickness between about 500 to 1500 Angstroms, completely filling SAC opening, or bit line contact hole 11. If polysilicon is used as the conductive layer, the polysilicon is doped in situ, during deposition, via the addition of arsine, or phosphine, to a silane ambient. A CMP procedure is next used to remove regions of the conductive layer, from the top surface of BPSG layer 10, resulting in the formation of bit line contact structure 12, in SAC opening, or bit line contact hole 11. This is schematically shown in FIG. 3.

Figure 4:
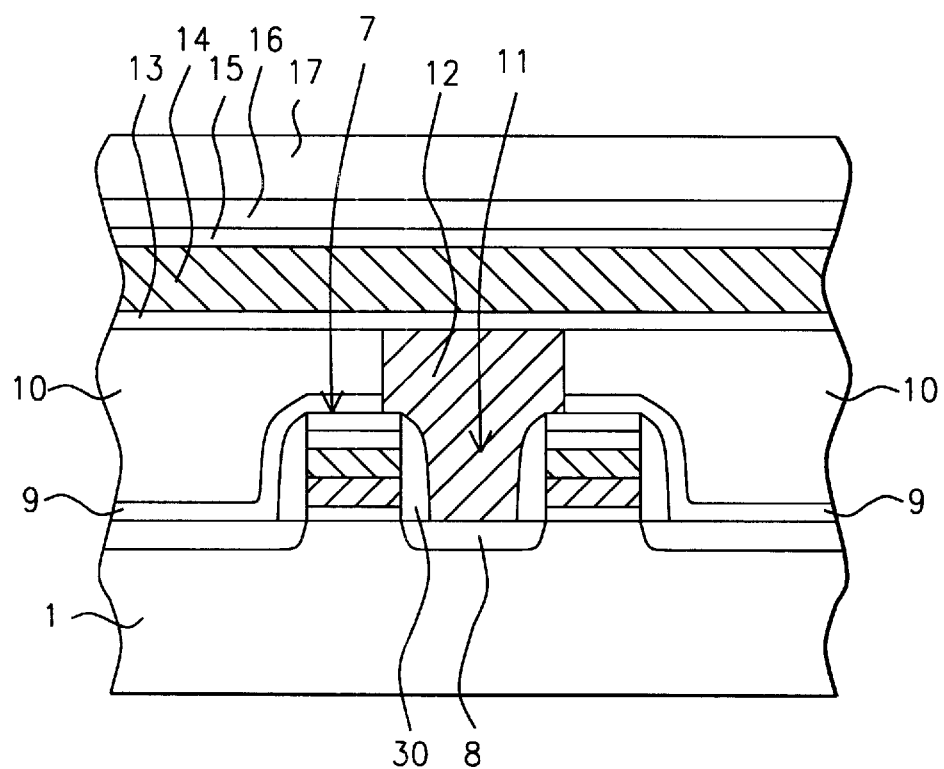

The materials used to for the bit line structure are next deposited, and shown schematically in FIG. 4. A titanium—titanium nitride, composite layer 13, is first deposited, via chemical vapor deposition, (CVD), or plasma vapor deposition, (PVD), procedures, at a thickness between about 500 to 1500 Angstroms. The underlying titanium component of the titanium—titanium nitride, composite layer 13, is used for adhesion to underlying materials, while the titanium nitride component is used as a barrier layer, protecting underlying materials from reaction products generated during a subsequent tungsten deposition process. Tungsten layer 14, is next deposited via CVD procedures, at a thickness between about 500 to 1500 Angstroms, using tungsten hexafluoride as a source. The sheet resistance of a bit line structure, fabricated using tungsten, is between about 1 to 3 ohms/square, whereas counterpart bit line structures, formed with tungsten silicide, exhibit sheet resistances between about 5 to 10 ohms/square.

The insulator materials needed to cap a subsequent tungsten bit line structure, are next deposited, and shown schematically in FIG. 4. A silicon oxide layer 16, with a dielectric constant lower than the dielectric constant of silicon nitride, is used as a component of a composite insulator capping layer, to reduce the coupling capacitance resulting from the composite insulator capped, tungsten bit line structure, and adjacent conductive structures. However if the surface of tungsten layer 14, is exposed during the deposition of silicon oxide layer 16, oxidation of a top portion of the tungsten layer can occur, resulting in an undesired increase in tungsten bit line resistance. Therefore prior to deposition of silicon oxide layer 16, a thin, underlying silicon nitride layer 15, is formed overlying tungsten layer 14, via LPCVD or PECVD procedures, at a thickness between about 40 to 60 Angstroms. Silicon oxide layer 16, is then deposited on underlying, silicon nitride layer 15, via LPCVD or PECVD procedures, at a thickness between about 100 to 500 Angstroms. The use of silicon oxide layer 16, will reduce coupling capacitance, however without degradation to the underlying tungsten layer, via placement of the thin silicon nitride layer 15, overlying, and protecting, tungsten layer 14, during the silicon oxide deposition. Finally a thick silicon nitride layer 17, is deposited on silicon oxide layer 16, via LPCVD or PECVD procedures, at a thickness between about 1000 to 3000 Angstroms. Silicon nitride layer 17, will provide the capping, and self-alignment properties, needed to cap a subsequent tungsten bit line structure.

Figure 5:
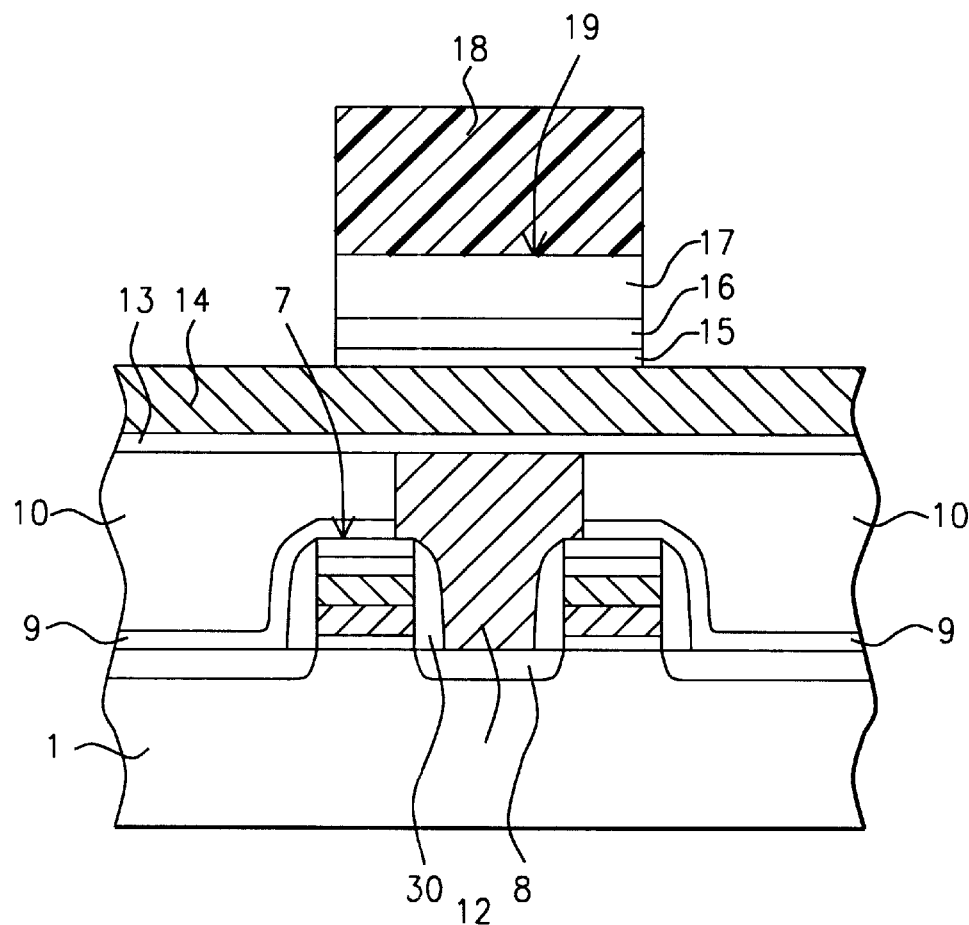
Figure 6:
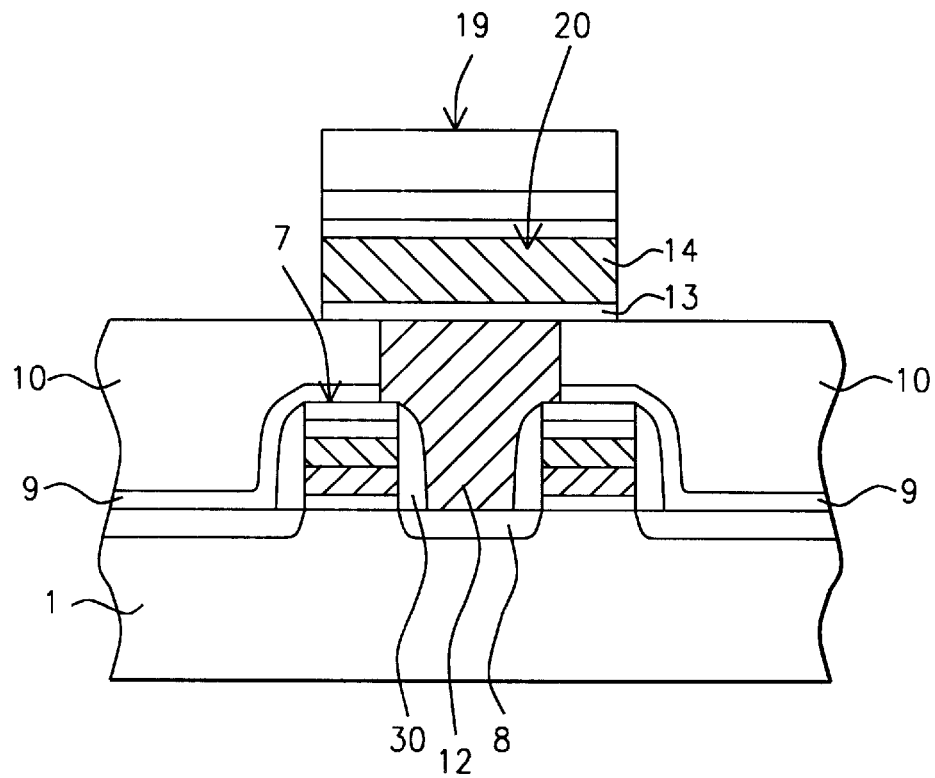

Photoresist shape 18, is then used as an etch mask, to allow composite insulator capping shape 19, to be formed via an anisotropic RIE procedure, using $CHF_3$ as an etchant for silicon nitride layer 17, and for silicon nitride layer 15, while $CHF_3$ is also used as an etchant for silicon oxide layer 16. This is schematically shown in FIG. 5. After removal of photoresist shape 18, via plasma oxygen ashing and careful wet cleans, composite insulator capping shape 19, is used as an etch mask, to allow formation of tungsten bit line structure 20, to be realized. Tungsten bit line structure 20, comprised from tungsten layer 14, and titanium—titanium nitride layer 13, shown schematically in FIG. 6, is formed via an anisotopic RIE procedure, using $SF_6+Cl_2$ as an etchant for both tungsten and titanium—titanium nitride.

Figure 7:
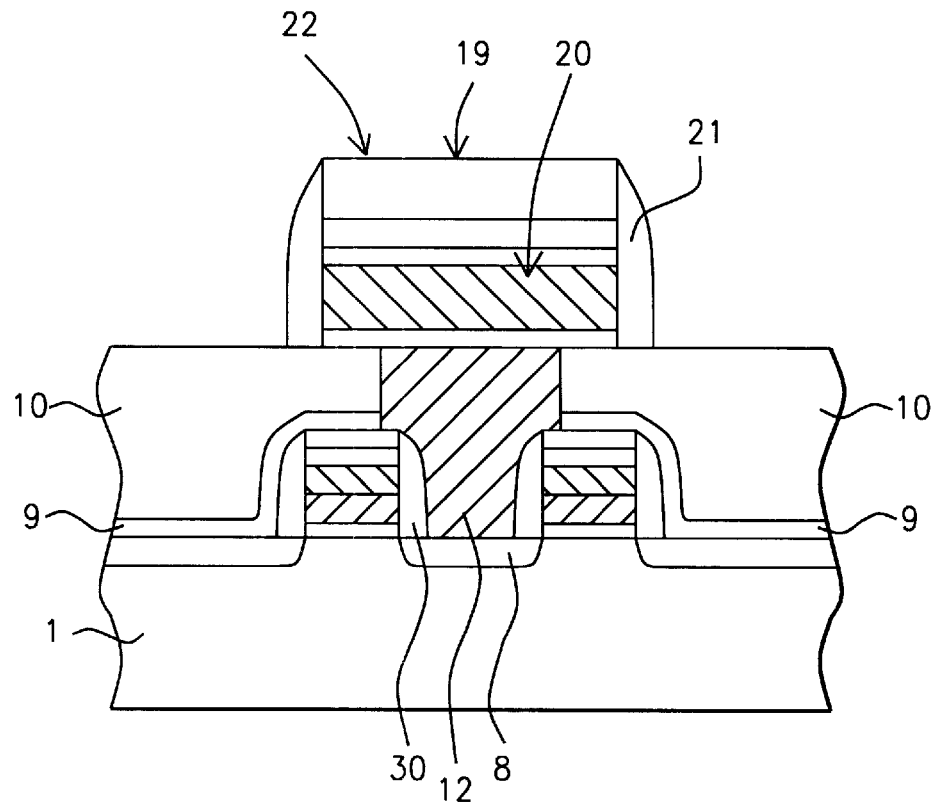

For subsequent self-alignment requirements for the composite insulator capped, tungsten bit line structure, silicon nitride spacers 30, shown schematically in FIG. 7, are formed on the sides of this structure. This is accomplished via deposition of a silicon nitride layer, obtained via LPCVD or PECVD procedures, at a thickness between about 200 to 700 Angstroms, followed by an anisotropic RIE procedure, using $CHF_3$ as an etchant. Tungsten bit line structure 20, is now encapsulated by silicon nitride spacers 30, and by composite insulator capping layer 19. The coupling capacitance of the encapsulated tungsten bit line structure has been reduced via the use of a silicon oxide component, used as part of composite insulator capping layer 19, while the use of silicon nitride layer 15, allowed overlying silicon oxide layer 16, to be formed without degradation, or oxidation of the underlying tungsten bit line structure.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a bit line structure, on a semiconductor substrate, comprising the steps of:

providing silicon nitride capped, gate structures, on an underlying gate insulator layer, with silicon nitride spacers on the sides of said silicon nitride capped, gate structures, and with an active device region, in an area of said semiconductor substrate, located between, but not covered by, said silicon nitride capped, gate structures;

opening a bit line contact hole in a composite insulator layer, exposing said active device region;

forming a bit line contact structure in said bit line contact hole;

forming a bit line structure, overlying and contacting, said bit line contact structure, with an overlying composite capping insulator shape, comprised with an underlying, thin silicon nitride layer, a silicon oxide layer, and an overlying, thick silicon nitride layer, overlying said bit line structure; and forming silicon nitride spacers on the sides of said bit line structure.

2. The method of claim 1, wherein said active device region, located between said silicon nitride capped, gate structures, is a source/drain region.

3. The method of claim 1, wherein said composite insulator layer is comprised of an underlying silicon nitride layer, obtained via LPCVD or PECVD procedures, at a thickness between about 600 to 800 Angstroms, and comprised of an overlying borophosphosilicate glass, (BPSG), layer, obtained via LPCVD or PECVD procedures, at a thickness between about 5000 to 8000 Angstroms, containing between about 3 to 5% $B_2O_3$ and between about 4 to 6% $P_2O_5$.

4. The method of claim 1, wherein said bit line contact hole, is a self-aligned contact, (SAC), opening, located between said silicon nitride capped, gate structures, exposing said active device region, formed in said composite insulator layer via an anisotropic RIE procedure, using $CHF_3$ as an etchant for said BPSG layer, and using $CHF_3$ as an etchant for said silicon nitride layer.

5. The method of claim 1, wherein said bit line contact structure is comprised of a material chosen from a group that includes; a doped polysilicon layer, a tungsten layer, or a tungsten silicide layer.

6. The method of claim 1, wherein said bit line structure is a tungsten bit line structure, comprised of tungsten, at a thickness between about 500 to 1500 Angstroms, overlying a titanium—titanium nitride layer, at a thickness between about 500 to 1500 Angstroms.

7. The method of claim 1, wherein said bit line structure has a sheet resistance between about 1 to 3 ohms/square.

8. The method of claim 1, wherein said composite capping insulator shape, is comprised of: said underlying, thin silicon nitride layer, obtained via LPCVD or PECVD procedures, at a thickness between about 40 to 60 Angstroms; said silicon oxide layer, obtained via LPCVD or PECVD procedures, at a thickness between about 100 to 500 Angstroms; and said overlying, thick silicon nitride layer, obtained via LPCVD or PECVD procedures, at a thickness between about 1000 to 3000 Angstroms.

9. A method of fabricating a tungsten bit line structure, capped with a composite insulator shape, on a semiconductor substrate, in which the composite insulator shape is comprised with a silicon oxide layer, sandwiched between silicon nitride layers, comprising the steps of:

providing silicon nitride capped, gate structures, on an underlying silicon dioxide gate insulator layer, with a source/drain region located in an area of said semiconductor substrate, not covered by said silicon nitride capped, gate structures, and with silicon nitride spacers located on the sides of said silicon nitride capped, gate structures;

depositing a first silicon nitride layer;

depositing an insulator layer;

planarizing said insulator layer;

forming a bit line contact hole in said insulator layer, and in said first silicon nitride layer, exposing the top surface of said source/drain region;

forming a bit line contact structure, in said bit line contact hole, overlying, and contacting, said source/drain region, located at the bottom of said bit line contact hole;

depositing a titanium—titanium nitride layer;

depositing a tungsten layer;

depositing a second silicon nitride layer, on said tungsten layer;

depositing a silicon oxide layer on said second silicon nitride layer;

depositing a third silicon nitride layer on said silicon oxide layer;

patterning of said third silicon nitride layer, of said silicon oxide layer, and of said second silicon oxide layer, to create said composite insulator shape, on said tungsten layer;

using said composite insulator shape as a mask to pattern said tungsten layer, and said titanium—titanium nitride layer, to create said tungsten bit line structure, capped with said composite insulator shape; and forming silicon nitride spacers on the sides of said composite insulator shape, and on the sides of said tungsten bit line structure.

10. The method of claim 9, wherein said first silicon nitride layer is obtained via LPCVD or PECVD procedures, at a thickness between about 600 to 800 Angstroms.

11. The method of claim 9, wherein said insulator layer is a borophosphosilicate glass layer, obtained via LPCVD or PECVD procedures, at a thickness between about 5000 to 8000 Angstroms, and containing between about 3 to 5% $B_2O_3$, and containing between about 4 to 6% $P_2O_5$.

12. The method of claim 9, wherein the planarization of said insulator layer is accomplished via a chemical mechanical polishing procedure.

13. The method of claim 9, wherein said bit line contact hole is formed, with a diameter between about 0.2 to 0.4 um, via an anisotropic RIE procedure, using $CHF_3$ as an etchant for said insulator layer, and also using $CHF_3$ as an etchant for said first silicon nitride layer.

14. The method of claim 9, wherein said bit line contact structure is comprised of a material chosen from a group that includes; a doped polysilicon layer, a tungsten layer, and a tungsten silicide layer.

15. The method of claim 9, wherein said tungsten layer is obtained via LPCVD procedures, at a thickness between about 500 to 1500 Angstroms, using tungsten hexafluoride as a source.

16. The method of claim 9, wherein said second silicon nitride layer is obtained via LPCVD or PECVD procedures, at a thickness between about 40 to 60 Angstroms.

17. The method of claim 9, wherein said silicon oxide layer is obtained via LPCVD or PECVD procedures, at a thickness between about 100 to 500 Angstroms.

18. The method of claim 9, wherein said third silicon nitride layer is obtained via LPCVD or PECVD procedures, at a thickness between about 1000 to 3000 Angstroms.

19. The method of claim 9, wherein said composite insulator shape is formed via an anisotropic RIE procedure, using $CHF_3$ as an etchant for said third silicon nitride layer, and for said second silicon nitride layer, while also using $CHF_3$ as an etchant for said silicon oxide layer.

20. The method of claim 9, wherein said tungsten bit line structure is formed via an anisotropic RIE procedure, using $SF_6+Cl_2$ as an etchant for said tungsten layer, and for said titanium—titanium nitride layer.

21. The method of claim 9, wherein said tungsten bit line structure exhibits a sheet resistance between about 1 to 3 ohms/square.

* * * * *